US012679412B2

(12) United States Patent
Zhang et al.

(10) Patent No.: US 12,679,412 B2
(45) Date of Patent: Jul. 14, 2026

(54) SAFETY AND PERFORMANCE FOR LOGIC DESIGN IN AUTONOMOUS VEHICLES

(71) Applicant: Apollo Autonomous Driving USA LLC, Sunnyvale, CA (US)

(72) Inventors: Manjiang Zhang, Sunnyvale, CA (US); Haofeng Kou, Sunnyvale, CA (US)

(73) Assignee: APOLLO AUTONOMOUS DRIVING USA LLC, Sunnyvale, CA (US)

( * ) Notice: Subject to any disclaimer, the term of this patent is extended or adjusted under 35 U.S.C. 154(b) by 850 days.

(21) Appl. No.: 18/058,009

(22) Filed: Nov. 22, 2022

(65) Prior Publication Data

US 2024/0166241 A1     May 23, 2024

(51) Int. Cl.
| | |
|---|---|
| *B60W 60/00* | (2020.01) |
| *B60W 50/029* | (2012.01) |
| *H03K 19/003* | (2006.01) |
| *B60W 50/00* | (2006.01) |

(52) U.S. Cl.
CPC ...... *B60W 60/0015* (2020.02); *B60W 50/029* (2013.01); *H03K 19/00392* (2013.01); *B60W 2050/0062* (2013.01); *B60W 2050/0292* (2013.01)

(58) Field of Classification Search
USPC .......................................................... 716/116
See application file for complete search history.

(56) References Cited

U.S. PATENT DOCUMENTS 9,690,894 B1 *  6/2017  Titley ...................... G06F 30/34

* cited by examiner

*Primary Examiner* — Bryce M Aisaka
(74) *Attorney, Agent, or Firm* — WOMBLE BOND DICKINSON (US) LLP

(57) ABSTRACT

The present disclosure provides a system and method that retrieves a plurality of logic blocks and a plurality of safety levels corresponding to the plurality of logic blocks. The system and method determines, by a processor, which of the plurality of logic blocks require one or more redundant logic blocks based on their corresponding safety level. The system and method produces a logic design based on the plurality of logic blocks and the one or more redundant logic blocks.

20 Claims, 5 Drawing Sheets

400

Logic Device 370

| Logic A (High) 405 | Logic A (High) 410 | Logic A (High) 415 | Reconfigurable Logic Block 435 |

Function Control Logic 440

| Voting 445 | Monitor 450 | Selection 455 |

| PR Control 460 | IF Data 465 |

| Logic B (Med) 420 | Logic B Partial (Med) 425 | Logic C (Low) 430 |

Host Interface 470

Host 480

Exchangeable Logic Blocks Store 380

SAFETY AND PERFORMANCE FOR LOGIC DESIGN IN AUTONOMOUS VEHICLES

TECHNICAL FIELD

Embodiments of the present disclosure relate generally to operating autonomous driving vehicles. More particularly, embodiments of the disclosure relate to producing logic designs for autonomous vehicles that have improved safety and performance capabilities.

BACKGROUND

Vehicles operating in an autonomous mode (e.g., driverless) can relieve occupants, especially the driver, from some driving-related responsibilities. When operating in an autonomous mode, the vehicle can navigate to various locations using onboard sensors, allowing the vehicle to travel with minimal human interaction or in some cases without any passengers.

Functional safety is a key factor in designing autonomous vehicles. Functional safety is a part of the overall safety of a system that depends on automatic protection operating correctly in response to inputs or failures in a predictable manner, such as properly handling human errors, systematic errors, hardware failures, and operational/environmental stress.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
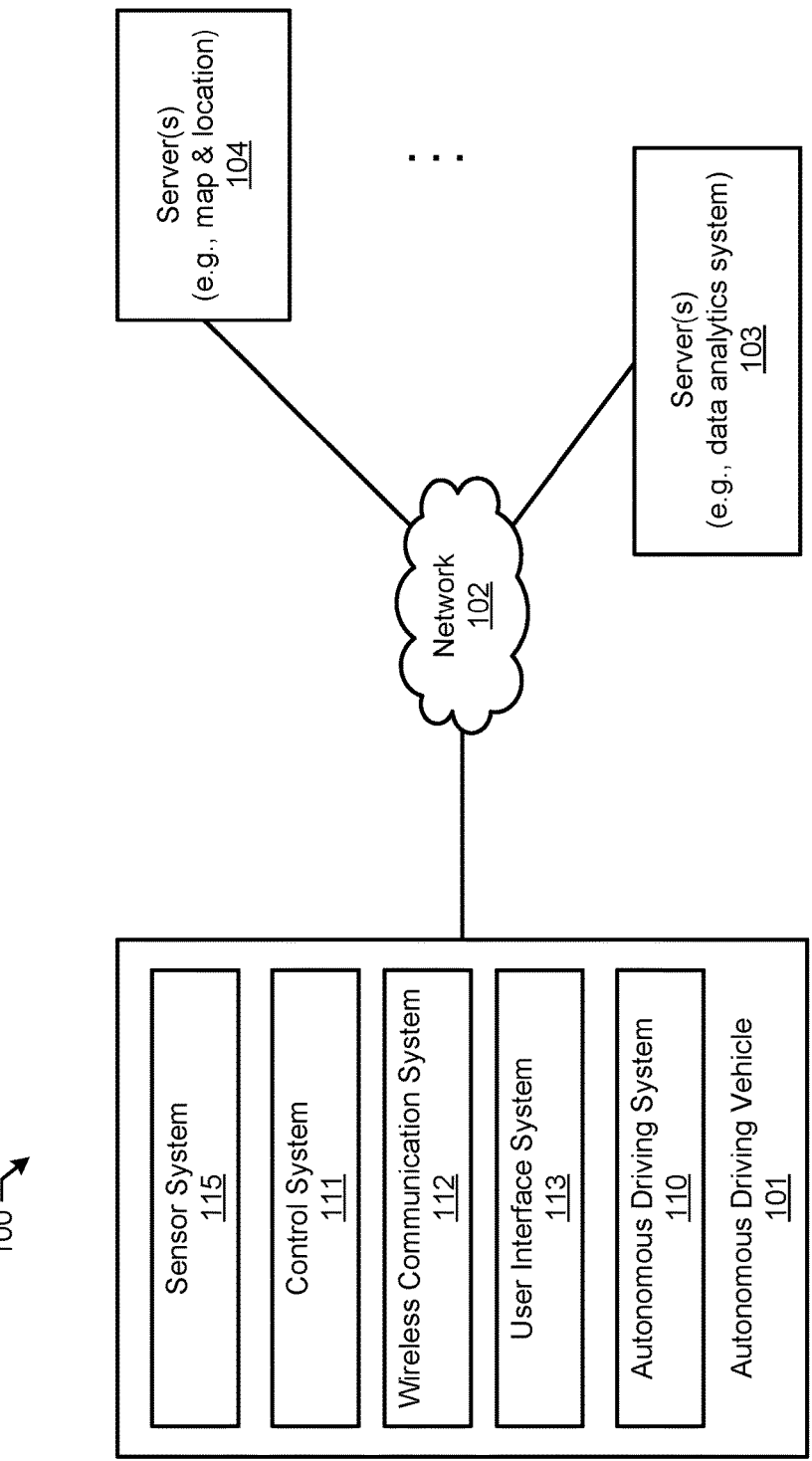
FIG. 1 is a block diagram illustrating a networked system, according to some embodiments of the present disclosure.

Various embodiments and aspects of the disclosures will be described with reference to the details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

As discussed above, functional safety is a key factor in designing autonomous vehicles. Autonomous vehicles utilize many logic devices to perform various functions, such as for computations on data to/from various sensors and their interfaces. To maintain a proper safety level, the logic devices require redundancy for critical areas of the design. Redundancy is the inclusion of extra components (e.g. logic blocks) in addition to those being used for the critical functionality to increase the reliability and availability of a system.

Some logic devices in an autonomous vehicle are field programmable gate arrays (FPGAs) or embedded FPGAs (eFPGAs), which provide partial reconfiguration features that can be used for non-safety related features to save logic resources and improve system performance. An FPGA is an integrated circuit designed to be configured by a designer. FPGA configuration is generally specified using a hardware description language (HDL). FPGAs contain an array of programmable logic blocks, and a hierarchy of reconfigurable interconnects allowing blocks to be wired together. The logic blocks can be configured to perform complex combinational functions, or act as simple logic gates. Many FPGAs can be reprogrammed to implement different logic functions, allowing flexible reconfigurable computing as performed in computer software. Embedded FPGA (Field Programmable Gate Array) or eFPGA, is a way to instantiate FPGA flexibility inside a System on a Chip (SoC) without the burden of external FPGA overhead. eFPGAs provide flexibility in critical areas where algorithm, protocol or market requirements are changing. Some logic devices in an autonomous vehicle are application-specific integrated circuits (ASICs). An ASIC is an integrated circuit (IC) chip customized for a particular use, rather than intended for general-purpose use. Application-specific standard product (ASSP) chips are intermediate between ASICs and industry standard integrated circuits.

Conventional logic design tools depend on a user to manually generate modules (e.g., logic blocks) without considering safety levels corresponding to their intended function. As such, conventional logic design tools do not insert redundancy into logic designs based on functional safety levels, nor do convention logic design tools insert capability into the logic design to dynamically swap exchangeable functions during runtime applications.

Accordingly, the present disclosure addresses the above-noted and other deficiencies by disclosing an approach for automatically adding redundant logic into a logic design based on safety-related features while also providing select/swap logic functionality in the logic design. According to some embodiments, a method retrieves logic blocks and safety levels corresponding to the logic blocks. The method determines which of the logic blocks require redundant logic blocks based on their corresponding safety level, such as fully redundant logic blocks or partially redundant logic blocks. The method then produces a logic design based on the logic blocks and the redundant logic blocks.

According to some embodiments, the method identifies a first logic block from the logic blocks having a corresponding high safety level, and creates one or more fully redundant logic blocks that duplicate the first logic block. The method then identifies a second logic block from the logic blocks having a corresponding medium safety level, and creates one or more partially redundant logic blocks that are a partial duplication of the second logic block. The method then adds, to the logic design, the first logic block, the one or more fully redundant logic blocks, the second logic block, and the one or more partially redundant logic blocks.

According to some embodiments, the method identifies one or more third logic blocks having a corresponding exchangeable safety level. The method determines one or more sizes of the one or more third logic blocks, and determines a reconfigurable logic block size based on the one or more sizes of the one or more third logic blocks. The method then adds a reconfigurable logic block to the logic design based on the reconfigurable logic block size.

According to some embodiments, the method adds a functional control block into the logic design that directs which one of the one or more exchangeable logic blocks to load into the reconfigurable logic block. According to some embodiments, the functional control block includes voting logic that produces a final value based on values from the first logic block and the one or more fully redundant logic blocks. The functional control block also includes selection logic that selects the second logic block or the one or more partially redundant logic blocks for one or more computations.

According to some embodiments, the method adds a host interface into the logic design, which loads the one or more third logic blocks to the reconfigurable logic block. According to some embodiments, the method accesses a configuration table that includes a list of logic block identifiers and the corresponding safety levels. The method then retrieves the logic blocks from a repository that match the list of logic block identifiers. In some embodiments, the repository includes one or more verified logic blocks.

FIG. 1 is a block diagram illustrating an autonomous driving network configuration using logic devices having logic designs generated from some embodiments of the present disclosure. Referring to FIG. 1, network configuration 100 includes autonomous driving vehicle (ADV) 101 that may be communicatively coupled to one or more servers 103-104 over a network 102. ADV 101 and servers 103-104 may include many logic devices having logic designs generated from embodiments of the present disclosure. Although there is one ADV shown, multiple ADVs can be coupled to each other and/or coupled to servers 103-104 over network 102. Network 102 may be any type of networks such as a local area network (LAN), a wide area network (WAN) such as the Internet, a cellular network, a satellite network, or a combination thereof, wired or wireless. Server(s) 103-104 may be any kind of servers or a cluster of servers, such as Web or cloud servers, application servers, backend servers, or a combination thereof. Servers 103-104 may be data analytics servers, content servers, traffic information servers, map and point of interest (MPOI) servers, or location servers, etc.

An ADV refers to a vehicle that can be configured to in an autonomous mode in which the vehicle navigates through an environment with little or no input from a driver. Such an ADV can include a sensor system having one or more sensors that are configured to detect information about the environment in which the vehicle operates. The vehicle and its associated controller(s) use the detected information to navigate through the environment. ADV 101 can operate in a manual mode, a full autonomous mode, or a partial autonomous mode.

In one embodiment, ADV 101 includes, but is not limited to, autonomous driving system (ADS) 110, vehicle control system 111, wireless communication system 112, user interface system 113, and sensor system 115. ADV 101 may further include certain common components included in ordinary vehicles, such as, an engine, wheels, steering wheel, transmission, etc., which may be controlled by vehicle control system 111 and/or ADS 110 using a variety of communication signals and/or commands, such as, for example, acceleration signals or commands, deceleration signals or commands, steering signals or commands, braking signals or commands, etc.

Components 110-115 may be communicatively coupled to each other via an interconnect, a bus, a network, or a combination thereof. For example, components 110-115 may be communicatively coupled to each other via a controller area network (CAN) bus. A CAN bus is a vehicle bus standard designed to allow microcontrollers and devices to communicate with each other in applications without a host computer. It is a message-based protocol, designed originally for multiplex electrical wiring within automobiles, but is also used in many other contexts.

Figure 2:
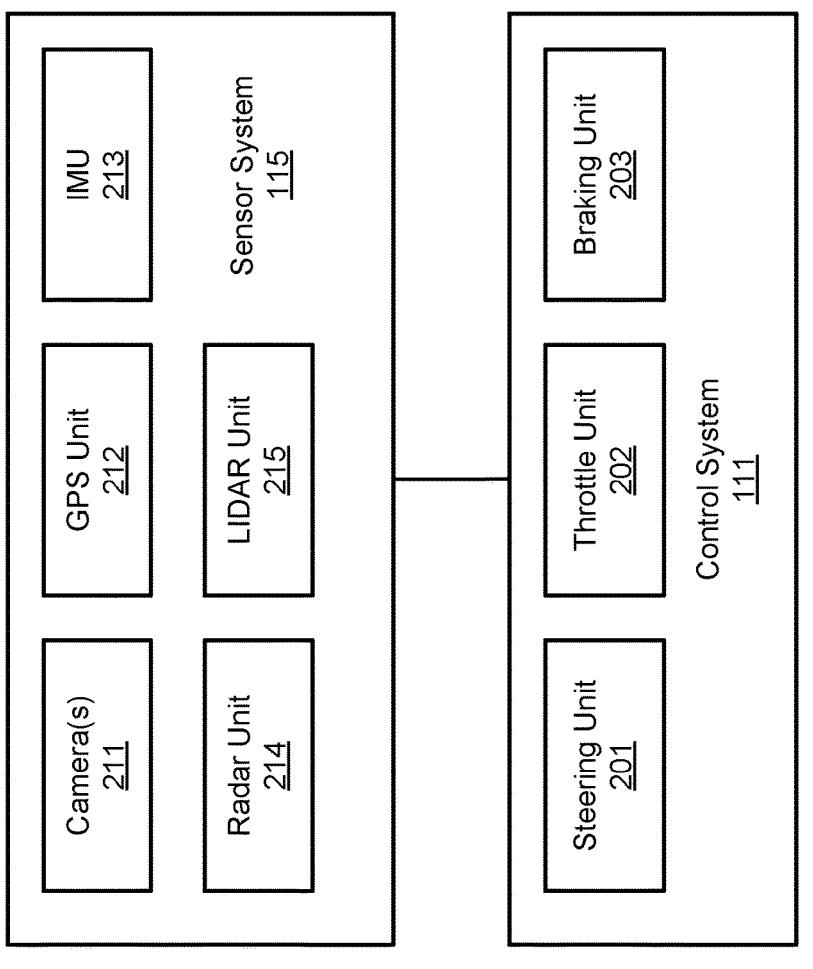
FIG. 2 is a block diagram illustrating an example of an autonomous driving vehicle, according to some embodiments of the present disclosure.
Figure 2:

Referring now to FIG. 2, in one embodiment, sensor system 115 includes, but it is not limited to, one or more cameras 211, global positioning system (GPS) unit 212, inertial measurement unit (IMU) 213, radar unit 214, and a light detection and range (LIDAR) unit 215. GPS system 212 may include a transceiver operable to provide information regarding the position of the ADV. IMU unit 213 may sense position and orientation changes of the ADV based on inertial acceleration. Radar unit 214 may represent a system that utilizes radio signals to sense objects within the local environment of the ADV. In some embodiments, in addition to sensing objects, radar unit 214 may additionally sense the speed and/or heading of the objects. LIDAR unit 215 may sense objects in the environment in which the ADV is located using lasers. LIDAR unit 215 could include one or more laser sources, a laser scanner, and one or more detectors, among other system components. Cameras 211 may include one or more devices to capture images of the environment surrounding the ADV. Cameras 211 may be still cameras and/or video cameras. A camera may be mechanically movable, for example, by mounting the camera on a rotating and/or tilting a platform.

Sensor system 115 may further include other sensors, such as, a sonar sensor, an infrared sensor, a steering sensor, a throttle sensor, a braking sensor, and an audio sensor (e.g., microphone). An audio sensor may be configured to capture sound from the environment surrounding the ADV. A steering sensor may be configured to sense the steering angle of a steering wheel, wheels of the vehicle, or a combination thereof. A throttle sensor and a braking sensor sense the throttle position and braking position of the vehicle, respectively. In some situations, a throttle sensor and a braking sensor may be integrated as an integrated throttle/braking sensor.

In one embodiment, vehicle control system 111 includes, but is not limited to, steering unit 201, throttle unit 202 (also referred to as an acceleration unit), and braking unit 203. Steering unit 201 is to adjust the direction or heading of the vehicle. Throttle unit 202 is to control the speed of the motor or engine that in turn controls the speed and acceleration of the vehicle. Braking unit 203 is to decelerate the vehicle by providing friction to slow the wheels or tires of the vehicle. Note that the components as shown in FIG. 2 may be implemented in hardware, software, or a combination thereof. For example, the components in FIG. 2 may be implemented in logic devices having logic designs generated from embodiments of the present disclosure.

Referring back to FIG. 1, wireless communication system 112 allows communication between ADV 101 and external systems, such as devices, sensors, other vehicles, etc. For example, wireless communication system 112 can wirelessly communicate with one or more devices directly or via a communication network, such as servers 103-104 over network 102. Wireless communication system 112 can use any cellular communication network or a wireless local area network (WLAN), e.g., using WiFi to communicate with another component or system. Wireless communication system 112 could communicate directly with a device (e.g., a mobile device of a passenger, a display device, a speaker within vehicle 101), for example, using an infrared link, Bluetooth, etc. User interface system 113 may be part of peripheral devices implemented within vehicle 101 including, for example, a keyboard, a touch screen display device, a microphone, and a speaker, etc.

Some or all of the functions of ADV 101 may be controlled or managed by ADS 110, especially when operating in an autonomous driving mode. ADS 110 includes the necessary hardware (e.g., processor(s), memory, storage) and software (e.g., operating system, planning and routing programs) to receive information from sensor system 115, control system 111, wireless communication system 112, and/or user interface system 113, process the received information, plan a route or path from a starting point to a destination point, and then drive vehicle 101 based on the planning and control information. Alternatively, ADS 110 may be integrated with vehicle control system 111.

For example, a user as a passenger may specify a starting location and a destination of a trip, for example, via a user interface. ADS 110 obtains the trip related data. For example, ADS 110 may obtain location and route data from an MPOI server, which may be a part of servers 103-104. The location server provides location services and the MPOI server provides map services and the POIs of certain locations. Alternatively, such location and MPOI information may be cached locally in a persistent storage device of ADS 110.

While ADV 101 is moving along the route, ADS 110 may also obtain real-time traffic information from a traffic information system or server (TIS). Note that servers 103-104 may be operated by a third party entity. Alternatively, the functionalities of servers 103-104 may be integrated with ADS 110. Based on the real-time traffic information, MPOI information, and location information, as well as real-time local environment data detected or sensed by sensor system 115 (e.g., obstacles, objects, nearby vehicles), ADS 110 can plan an optimal route and drive vehicle 101, for example, via control system 111, according to the planned route to reach the specified destination safely and efficiently.

Figure 3:
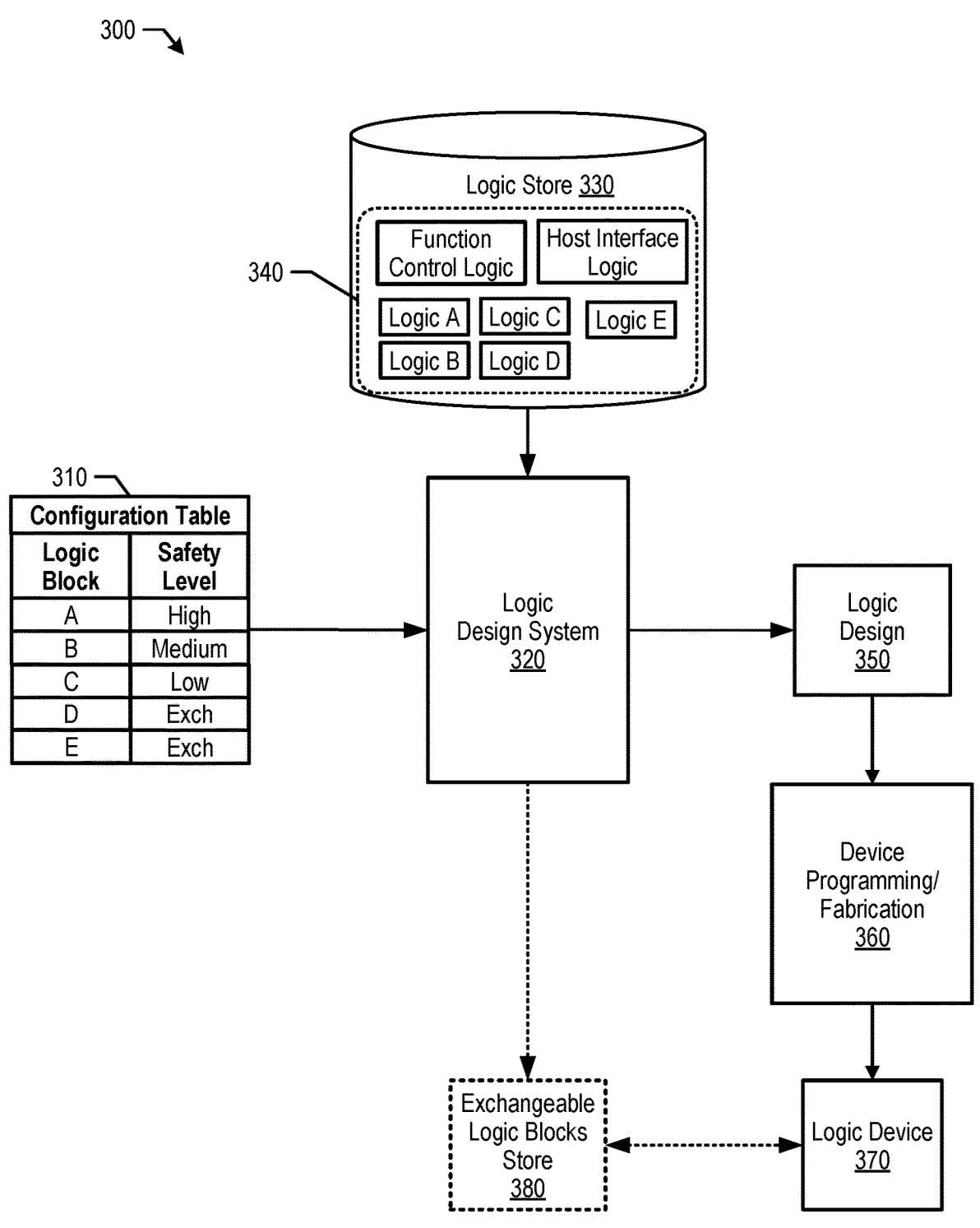
FIG. 3 is a block diagram illustrating an example of inserting functional redundancy and functional selection into a logic design based on functional safety levels, according to some embodiments of the present disclosure.

FIG. 3 is a block diagram illustrating an example of inserting functional redundancy and functional selection into a logic design based on functional safety levels, according to some embodiments of the present disclosure.

Diagram 300 includes logic design system 320. In some embodiments, a designer provides configuration table 310 to logic design system 320 that maps functional logic blocks to their corresponding safety levels. In some embodiments, the corresponding logic blocks 340 are stored in logic store 330, which may be generated from scripts, selected from RTL designs, or be post-implementation blocks (e.g., verified logic blocks) to improve safety levels.

Logic design system 320 receives configuration table 310 and evaluates the included list of logic blocks (e.g., functional blocks) and their corresponding safety levels. In some embodiments, the functional redundancy required for various safety levels are:

High: Requires full redundancy;

Medium: Requires partial redundancy;

Low: Requires no redundancy;

Exchangeable: Dynamic configuration and requires no redundancy.

Configuration table 310 shows that logic block A has a high safety level and requires full redundancy, logic block B has a medium safety level and requires partial redundancy, logic block C does not require redundancy, and logic blocks D and E are dynamically reconfigurable (e.g., "Exch" for exchangeable) and do not require redundancy.

Logic design system 320 retrieves the corresponding logic blocks 340 from logic store 330. Logic design system 320 produces fully redundant logic blocks form logic block A, a partially redundant logic block for logic block B, and inserts the fully redundant logic blocks, the partially redundant logic block, along with logic blocks A, B, and C into logic design 350. In some embodiments, logic design system stores the exchangeable logic blocks in exchangeable logic blocks store 380 for runtime access by logic device 370.

Logic design system 320 also adds, from logic store 330, a function control logic block and a host interface logic block into logic design 350. The function control logic block adds safety control, module selection, function swap features, etc. into logic design 350, and the host interface block provides an interface to the exchangeable logic blocks in exchangeable logic blocks store 380 (see FIG. 4 and corresponding text for further details).

In addition, logic design system 320 evaluates the size of logic block D and logic block E to determine the size of the reconfigurable logic block size. For example, if logic block D is 2 MB and logic block E is 3 MB, logic design system 320 sets the size of the reconfigurable logic block to at least 3 MB. In some embodiments, the reconfigurable logic block is a fixed size based on the properties of the corresponding logic device 370. For example, logic device 370 may be an FPGA with a set reconfiguration logic block size of 5 MB.

Device programming/fabrication 360 produces logic device 370 using logic design 350. For example, if logic device 370 is an FPGA, device programming/fabrication 360 programs logic device 370 using logic design 350. If logic device 370 is a custom device, such as an ASIC, device programming/fabrication 360 may be a manufacturing facility that fabricates logic device 370 using logic design 350.

Figure 4:
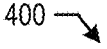
FIG. 4 is a block diagram illustrating an example of a logic device that includes functional redundancy and functional selection based on functional safety levels, according to some embodiments of the present disclosure.

FIG. 4 is a block diagram illustrating an example of a logic device that includes functional redundancy and functional selection based on functional safety levels, according to some embodiments of the present disclosure.

Diagram 400 shows logic device 370, which includes fully redundant logic blocks and partially redundant logic blocks. Referring to FIG. 3, configuration table 310 indicates that logic block A has a high safety level and, as such, diagram 400 shows that logic device 370 includes logic block A 405 and two fully redundant logic blocks A 410 and 415. Configuration table 310 also indicates that logic block B has a medium safety level and, as such, diagram 400 shows that logic device 370 includes logic block B 420 and partially redundant logic block B 425. In some embodiments, logic design system 320 determines which logic in logic block B 420 to duplicate based on various factors. For example, logic design system 320 may duplicate the more important safety features of logic block B 420, such as Automotive Safety Integrity Level (ASIL) A level critical safety functions (e.g., braking the ADV), and not duplicate the less important features such as ASIL B level safety functions (e.g., occasional pixel errors in camera data).

Configuration table 310 indicates that logic block C has a low safety level and, as such, diagram 400 shows that logic device 370 includes logic block C 430 without any redundancy. Logic device 370 also includes reconfigurable logic block 435, which is the logic area that one of exchangeable logic blocks D or E are loaded from exchangeable logic blocks store 380.

Function control logic 440 includes voting logic 445, monitor logic 450, selection logic 455, partial reconfiguration (PR) control logic 460, and interface (IF) data logic 465. Voting logic 445 uses a voting scheme (e.g., two out of three) that compares results from fully redundant logic blocks (logic blocks A 405, 410, and 415) and determines a final result. For example, voting logic 445 may receive results of 'true,' true,' and 'false' from logic blocks A 405, 410, and 415, respectively, and determine a final result of 'true.'

Monitor logic 450 monitors the status of logic blocks A 405-415 as well as the status of logic blocks B 420 and 425. When monitor logic 450 detects a hard failure with logic block B 420, monitor logic 450 instructs selection logic 455 to disable logic block B 420 and select logic block B 425 for further computations.

PR control logic 460 and IF data logic 465 manage which one of the exchangeable logic blocks are loaded into reconfigurable logic block 435 from exchangeable logic blocks store 380. Host interface 470 receives/transmits information to/from function control logic 440 and loads exchangeable logic blocks into reconfigurable logic block 435 from exchangeable logic blocks store 380 via host 489.

Figure 5:
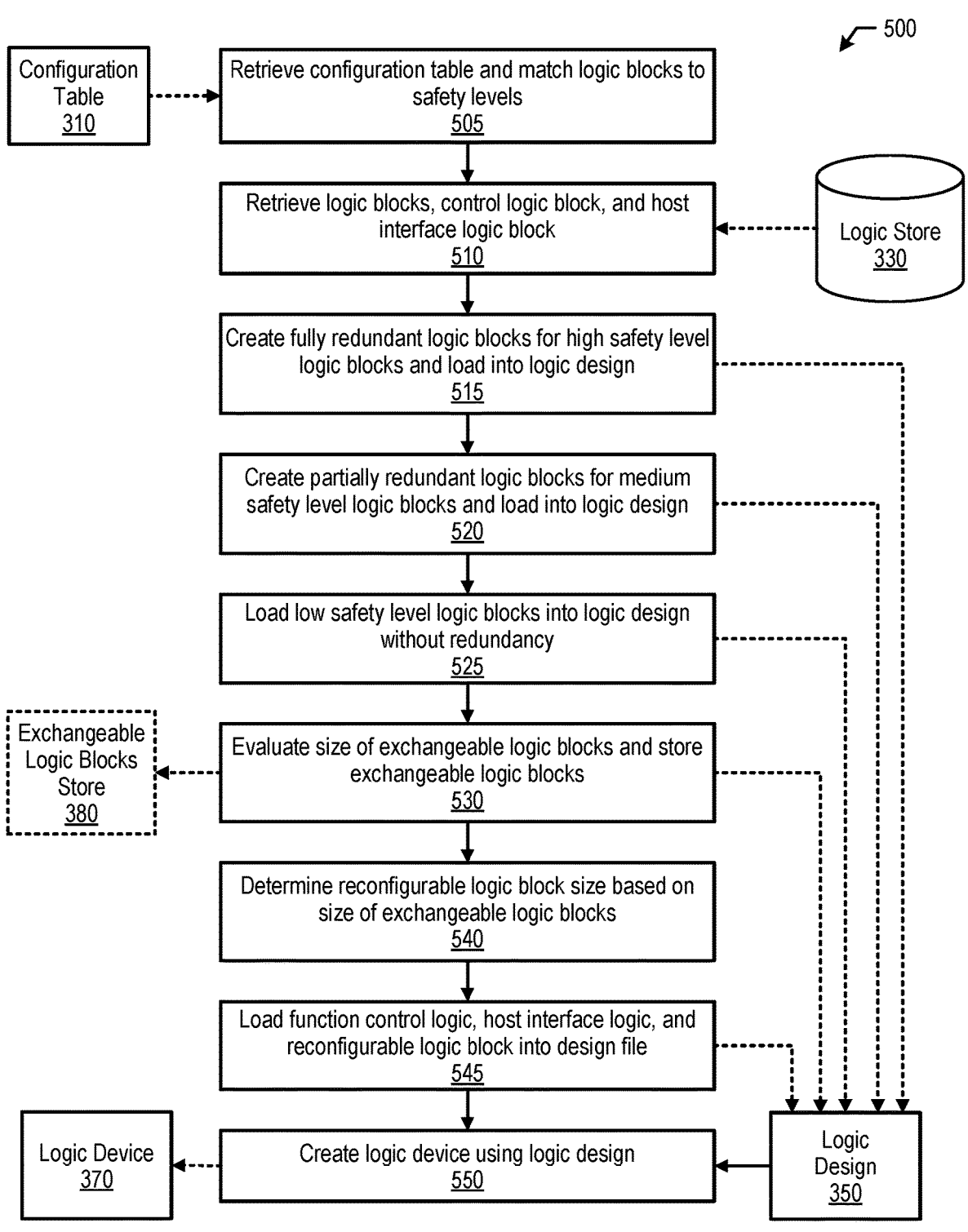
FIG. 5 is a flow diagram illustrating a method for adding redundant logic into a logic design that corresponds to safety-related features while also providing select/swap logic function capabilities in real applications, according to some embodiments of the present disclosure.

FIG. 5 is a flow diagram illustrating a method for adding redundant logic into a logic design that corresponds to safety-related features while also providing select/swap logic function capabilities in real applications, according to some embodiments of the present disclosure. Process 500 may be performed by processing logic that may include software, hardware, or a combination thereof. For example, process 500 may be performed by a processor executing on logic design system 320 as shown in FIG. 3.

At operation 505, processing logic retrieves configuration table 310 and evaluates the different safety levels of the different logic blocks. At operation 510, processing logic retrieves the logic blocks, the function control logic block, and the host interface logic block from logic store 330.

At operation 515, processing logic creates fully redundant logic blocks for high safety level logic blocks and loads the high safety level logic blocks and their corresponding fully redundant logic blocks into logic design 350. At operation 520, processing logic creates partially redundant logic blocks for medium safety level logic blocks and loads the medium safety level logic blocks and their corresponding partially redundant logic blocks into logic design 350. At operation 525, processing logic loads low safety level logic blocks into logic design 350 without generating redundant logic blocks.

At operation 530, processing logic evaluates the size of the exchangeable logic blocks and stores the exchangeable logic blocks in exchangeable logic block store 380. At operation 540, processing logic determines a reconfigurable logic block size based on the size of the exchangeable logic blocks stored in exchangeable logic blocks store 380. For example, if there are three exchangeable logic blocks with sizes of 1 MB, 1.5 MB, and 2 MB, processing logic determines that the reconfigurable logic block size should be at least 2 MB to accommodate the largest exchangeable logic block. In some embodiments, the reconfigurable logic block size is a fixed value. In these embodiments, processing logic may verify that each one of the exchangeable logic blocks will fit in the reconfigurable logic block and generate an error if the size of one of the exchangeable logic blocks exceeds the fixed size of the reconfigurable logic block.

At operation 545, processing logic loads the functional control logic, the host interface block, and the reconfigurable logic block into logic design 350. At operation 550, processing logic creates logic device 370 using logic design 350. For example, if logic device 370 is an FPGA, processing logic programs the FPGA at operation 550 using logic design 350. In some embodiments, when logic device 370 is an ASIC or other fabricated device, operation 550 may send logic design 350 to a fabrication facility to produce logic device 370.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A method comprising:
retrieving a plurality of logic blocks and a plurality of safety levels corresponding to the plurality of logic blocks;
determining, by a processor, which of the plurality of logic blocks require one or more fully redundant logic blocks, and which of the plurality of logic blocks require one or more partially redundant logic blocks based on their corresponding safety level; and
producing a logic design based on the plurality of logic blocks, the one or more fully redundant logic blocks, and the one or more partially redundant logic blocks.

2. The method of claim 1, wherein the determining further comprises:
identifying a first logic block from the plurality of logic blocks having a corresponding first safety level;
producing the one or more fully redundant logic blocks that duplicate the first logic block;
identifying a second logic block from the plurality of logic blocks having a corresponding second safety level;
producing the one or more partially redundant logic blocks that are a partial duplication of the second logic block; and
adding, to the logic design, the first logic block, the one or more fully redundant logic blocks, the second logic block, and the one or more partially redundant logic blocks.

3. The method of claim 2, further comprising:
identifying one or more third logic blocks having a corresponding third safety level;
determining one or more sizes of the one or more third logic blocks;
determining a reconfigurable logic block size based on the one or more sizes of the one or more third logic blocks; and
adding a reconfigurable logic block to the logic design based on the reconfigurable logic block size.

4. The method of claim 3, further comprising:
adding a functional control block into the logic design, wherein the functional control block directs which one of the one or more third logic blocks to load into the reconfigurable logic block.

5. The method of claim 4, wherein the functional control block comprises voting logic that produces a final value based on values from the first logic block and the one or more fully redundant logic blocks, and wherein the functional control block comprises selection logic that selects the second logic block or the one or more partially redundant logic blocks for one or more computations.

6. The method of claim 3, further comprising:
adding a host interface into the logic design, wherein the host interface loads the one or more third logic blocks to the reconfigurable logic block.

7. The method of claim 1, further comprising:
accessing a configuration table that comprises a list of logic block identifiers and the corresponding plurality of safety levels; and
retrieving the plurality of logic blocks from a repository that match the list of logic block identifiers, wherein the repository comprises one or more verified logic blocks.

8. A non-transitory machine-readable medium having instructions stored therein, which when executed by a processor, cause the processor to perform operations, the operations comprising:
retrieving a plurality of logic blocks and a plurality of safety levels corresponding to the plurality of logic blocks;
determining, by the processor, which of the plurality of logic blocks require one or more fully redundant logic block, and which of the plurality of logic blocks require one or more partially redundant logic blocks based on their corresponding safety level; and
producing a logic design based on the plurality of logic blocks, the one or more fully redundant logic blocks, and the one or more partially redundant logic blocks.

9. The non-transitory machine-readable medium of claim 8, wherein the operations further comprise:
identifying a first logic block from the plurality of logic blocks having a corresponding first safety level;
producing the one or more fully redundant logic blocks that duplicate the first logic block;
identifying a second logic block from the plurality of logic blocks having a corresponding second safety level;
producing the one or more partially redundant logic blocks that are a partial duplication of the second logic block; and
adding, to the logic design, the first logic block, the one or more fully redundant logic blocks, the second logic block, and the one or more partially redundant logic blocks.

10. The non-transitory machine-readable medium of claim 9, wherein the operations further comprise:
identifying one or more third logic blocks having a corresponding third safety level;
determining one or more sizes of the one or more third logic blocks;
determining a reconfigurable logic block size based on the one or more sizes of the one or more third logic blocks; and
adding a reconfigurable logic block to the logic design based on the reconfigurable logic block size.

11. The non-transitory machine-readable medium of claim 10, wherein the operations further comprise:

adding a functional control block into the logic design, wherein the functional control block directs which one of the one or more third logic blocks to load into the reconfigurable logic block.

12. The non-transitory machine-readable medium of claim 11, wherein the functional control block comprises voting logic that produces a final value based on values from the first logic block and the one or more fully redundant logic blocks, and wherein the functional control block comprises selection logic that selects the second logic block or the one or more partially redundant logic blocks for one or more computations.

13. The non-transitory machine-readable medium of claim 10, wherein the operations further comprise adding a host interface into the logic design, wherein the host interface loads the one or more third logic blocks to the reconfigurable logic block.

14. The non-transitory machine-readable medium of claim 8, wherein the operations further comprise:

accessing a configuration table that comprises a list of logic block identifiers and the corresponding plurality of safety levels; and retrieving the plurality of logic blocks from a repository that match the list of logic block identifiers, wherein the repository comprises one or more verified logic blocks.

15. A system comprising:

a processing device; and a memory to store instructions that, when executed by the processing device cause the processing device to:

retrieve a plurality of logic blocks and a plurality of safety levels corresponding to the plurality of logic blocks;

determine, by a processor, which of the plurality of logic blocks require one or more fully redundant logic blocks, and which of the plurality of logic blocks require one or more partially redundant logic blocks based on their corresponding safety level; and produce a logic design based on the plurality of logic blocks, the one or more fully redundant logic blocks, and the one or more partially redundant logic blocks.

16. The system of claim 15, wherein the processing device further to:

identify a first logic block from the plurality of logic blocks having a corresponding first safety level;

produce the one or more fully redundant logic blocks that duplicate the first logic block;

identify a second logic block from the plurality of logic blocks having a corresponding second safety level;

produce the one or more partially redundant logic blocks that are a partial duplication of the second logic block; and add, to the logic design, the first logic block, the one or more fully redundant logic blocks, the second logic block, and the one or more partially redundant logic blocks.

17. The system of claim 16, wherein the processing device further to:

identify one or more third logic blocks having a corresponding third safety level;

determine one or more sizes of the one or more third logic blocks;

determine a reconfigurable logic block size based on the one or more sizes of the one or more third logic blocks; and add a reconfigurable logic block to the logic design based on the reconfigurable logic block size.

18. The system of claim 17, wherein the processing device further to:

add a functional control block into the logic design, wherein the functional control block directs which one of the one or more third logic blocks to load into the reconfigurable logic block, and wherein the functional control block comprises voting logic that produces a final value based on values from the first logic block and the one or more fully redundant logic blocks, and wherein the functional control block comprises selection logic that selects the second logic block or the one or more partially redundant logic blocks for one or more computations.

19. The system of claim 17, wherein the processing device further to:

adding a host interface into the logic design, wherein the host interface loads the one or more third logic blocks to the reconfigurable logic block.

20. The system of claim 15, wherein the processing device further to:

access a configuration table that comprises a list of logic block identifiers and the corresponding plurality of safety levels; and retrieve the plurality of logic blocks from a repository that match the list of logic block identifiers, wherein the repository comprises one or more verified logic blocks.

* * * * *